(12) United States Patent
Khouri et al.

(10) Patent No.: US 6,754,107 B2
(45) Date of Patent: Jun. 22, 2004

(54) SINGLE SUPPLY VOLTAGE, NONVOLATILE PHASE CHANGE MEMORY DEVICE WITH CASCODED COLUMN SELECTION AND SIMULTANEOUS WORD READ/WRITE OPERATIONS

(75) Inventors: Osama Khouri, Milan (IT); Ferdinando Bedeschi, Taranto (IT)

(73) Assignees: STMicroelectronics S.r.l., Agrate Brianza (IT); Ovonyx Inc., Boise, ID (US)

( * ) Notice: Subject to any disclaimer, the term of this patent is extended or adjusted under 35 U.S.C. 154(b) by 0 days.

(21) Appl. No.: 10/331,185

(22) Filed: Dec. 27, 2002

(65) Prior Publication Data

US 2003/0223285 A1 Dec. 4, 2003

(30) Foreign Application Priority Data

Dec. 27, 2001 (EP) ............................................ 01830808

(51) Int. Cl.[7] ............................................. G11C 16/06
(52) U.S. Cl. ............................ 365/185.23; 365/185.18; 365/230.08
(58) Field of Search ....................... 365/185.23, 185.18, 365/230.08, 230.06, 189.05

(56) References Cited

U.S. PATENT DOCUMENTS 5,576,990 A * 11/1996 Camerlenghi et al. . 365/185.23
5,610,860 A    3/1997 Rouy .................... 365/185.18
5,729,162 A * 3/1998 Rouy ......................... 327/103
6,061,295 A * 5/2000 Roh ........................... 365/233

FOREIGN PATENT DOCUMENTS

EP      0 745 995 A1   12/1996
EP      0 776 012 A2    5/1997

* cited by examiner

Primary Examiner—Anh Phung
(74) Attorney, Agent, or Firm—Lisa K. Jorgenson; David V. Carlson; Seed IP Law Group PLLC

(57) ABSTRACT

A nonvolatile memory device is described comprising a memory array, a row decoder and a column selector for addressing the memory cells of the memory array, and a biasing stage for biasing the array access device terminal of the addressed memory cell. The biasing stage is arranged between the column selector and the memory array and comprises a biasing transistor having a drain terminal connected to the column selector, a source terminal connected to the array access device terminal of the addressed memory cell, and a gate terminal receiving a logic driving signal, the logic levels of which are defined by precise and stable voltages and are generated by a logic block and an output buffer cascaded together. The output buffer may be supplied with either a read voltage or a program voltage supplied by a multiplexer. The biasing transistor may be either included as part of the column selector and formed by the selection transistor which is closest to the addressed memory cell or distinct from the selection transistors of the column selector.

12 Claims, 5 Drawing Sheets

SINGLE SUPPLY VOLTAGE, NONVOLATILE PHASE CHANGE MEMORY DEVICE WITH CASCODED COLUMN SELECTION AND SIMULTANEOUS WORD READ/WRITE OPERATIONS

FIELD OF THE INVENTION

The present invention relates to a single supply voltage, nonvolatile memory device with cascoded column selection and simultaneous word read/write operations.

In particular, the present invention advantageously, but not exclusively, finds application in nonvolatile phase change memory devices, to which the following discussion will make explicit reference without any loss of generality thereby.

BACKGROUND OF THE INVENTION

As is known, nonvolatile memory devices comprise a memory array formed by memory cells arranged in rows and columns, wherein word lines connect the gate terminals of the cells arranged on a same row and bit lines connect the array access device terminals (commonly drain terminals) of the cells arranged on one and the same column.

Individual rows of the memory array are addressed by a row decoder which receives an encoded address and biases the word line of the row being addressed at a stable and precise voltage, the value whereof depends upon the operation to be performed (read, program, verify, erase), while individual columns of the memory array are selected by a column selector which receives the outputs of a column decoder supplied with the above encoded address. The bitline of the column being addressed is biased such as to ensure that the array access device terminal of the memory cell addressed is biased at a preset electrical potential, which depends on the operation to be performed; this potential must be precise, stable and controlled since its precision affects not only the precision of the levels programmed in the memory cells, but also the programming time of the memory cells or, in read operation, the correct detection of the cell's content.

Phase change memory (PCM) devices are based on storage elements that use a class of materials which have the property of changing between two phases having distinct electrical characteristics. For example, these materials may change from an amorphous, disorderly phase to a crystalline or polycrystalline, orderly phase, and the two phases are associated to considerably different values of resistivity.

At present, alloys of elements of group VI of the periodic table, such as Te or Se, referred to as chalcogenides or chalcogenic materials, can advantageously be used in phase-change cells. The chalcogenide that currently offers the most promise is formed by a Ge, Sb and Te alloy (Ge2Sb2Te5) and is widely used for storing data in overwritable disks.

In chalcogenides, the resistivity varies by two or more orders of magnitude when the material passes from the amorphous phase (more resistive) to the crystalline phase (more conductive) and vice versa. The characteristics of the chalcogenides in the two phases are shown in FIG. 1. As may be noted, at a given read voltage, here designated by Vr, there is a variation in resistance of more than 10.

Phase change may be obtained by locally increasing the temperature, as shown in FIG. 2. Below 150° C. both phases are stable. Above 200° C. (nucleation starting temperature, designated by Tx), there takes place fast nucleation of the crystallites, and, if the material is kept at the crystallization temperature for a sufficient length of time (time t2), it changes its phase and becomes crystalline. To bring the chalcogenide back into the amorphous state, it is necessary to raise the temperature above the melting temperature Tm (approximately 600° C.) and then to cool the chalcogenide off rapidly (time t1).

From the electrical standpoint, it is possible to reach both the critical temperatures, namely the crystallization temperature and the melting point, by causing a current to flow through a resistive element which heats the chalcogenic material by the Joule effect.

The basic structure of a phase change storage element 1 which operates according to the principles described above is shown in FIG. 3 and comprises a resistive element 2 (heater) and a programmable element 3. The programmable element 3 is made with a chalcogenide and is normally in the crystalline state in order to enable a good flow of current. One part of the programmable element 3 is in direct contact with the resistive element 2 and forms a phase change portion 4.

If an electric current having an appropriate value is made to pass through the resistive element 2, it is possible to heat the phase change portion 4 selectively up to the crystallization temperature or to the melting temperature and to cause phase change.

The state of the chalcogenic material can be measured by applying a sufficiently small voltage, such as not to cause a sensible heating, and by then reading the current that is flowing. Given that the current is proportional to the conductivity of the chalcogenide, it is possible to discriminate wherein state the chalcogenide is.

Of course, the chalcogenide can be electrically switched between different intermediate states, thus affording the possibility of obtaining a multilevel memory.

In practice, a phase change memory element or PCM storage element 1 can be considered as a resistor which conducts a different current according to its phase. In particular, the following convention is adopted: a phase change storage element is defined as "set" when, once it is appropriately biased, it conducts a detectable current (this condition may be associated to a logic condition "1") and as "reset" when, in the same biasing conditions, it does not conduct current or conducts a much lower current than that of a cell that is set (logic condition "0").

The use of PCM storage elements has already been proposed in memory arrays formed by a plurality of memory cells arranged on rows and columns. In order to prevent the memory cells from being affected by noise caused by adjacent memory cells, generally each memory cell comprises a PCM storage element of the type described above and a selection element, such as a MOS transistor or a diode, in series to the PCM storage element.

When the selection element is a diode, each cell is connected at the intersection of two selection lines, perpendicular to one another, one of which is parallel to the rows of the memory array, while the other is parallel to the columns.

When the selection element is a transistor, different solutions are known which are essentially based upon biasing the source terminal of the selection element at variable voltages that depend upon the reading or programming operation (set, reset) of the memory. For example, according to U.S. Pat. No. 6,314,014, a first terminal of the PCM storage element is biased at a biasing voltage the value of which depends upon the operation (either reading or programming) of the memory cell, a second terminal of the PCM storage element is connected to a drain terminal of the selection transistor, the gate terminal of the selection transistor is connected to a row line, and the source terminal of the selection transistor is connected to a column line. In practice, selection of the memory cell takes place via the source and gate terminals of the selection transistor. Alternatively, the drain terminal of the selection transistor can be biased at the biasing voltage, and the memory cell can be coupled between the source terminal and its own column line.

It is moreover known that nonvolatile memory devices are typically of a single supply voltage type; namely, they receive from outside a single supply voltage currently having a value of 3 V±10% or else 1.8 V±10%; hence voltages having much higher values than the supply voltages and required in the various operations performed on the memory cells (read, program, verify, erase) are generated inside the nonvolatile memory device by voltage boosting circuits, generally known as "voltage boosters" or "charge pumps".

The boosted voltages supplied by voltage boosting circuits are, however, generally far from stable, and consequently are regulated and stabilized by voltage regulators.

FIG. 4 is a schematic illustration of a known nonvolatile memory device, of which only the parts necessary for understanding the problem to be solved by the present invention are shown.

In particular, in FIG. 4, reference number 10 designates a nonvolatile memory device as a whole, 11 designates the memory array, 12 designates the row decoder, 13 designates the column selector, 14 designates the addressed word line, 15 designates the addressed bit line, 16 designates the addressed phase change memory cell, 17 designates a supply line set at the supply voltage $V_{DD}$ supplied from outside to the nonvolatile memory device 10, 18 designates the charge pump, having an input connected to the supply line 17 and supplying a boosted voltage higher than the supply voltage $V_{DD}$, and 19 designates the voltage regulator, which receives the boosted voltage and supplies a regulated voltage, which is supplied to the column selector 13 in the programming step.

In particular, for each bit line 15 of the memory array 11, the column selector 13 can be schematically represented by a plurality of selection switches implemented by NMOS or PMOS transistors, connected in series and receiving on their control terminals respective column select signals. The number of selection switches for each bit line 15 depends upon the size of the memory array 11 or of the sectors of the memory array and upon the hierarchical organization of the column selector. FIG. 4 illustrates by way of example a column selector 13 formed, for each bit line 15, by three selection switches, designated by 20, 21 and 22, which receive on their control terminals respective column selection signals YM, YN and YO, which, in turn are generated by a column decoder as well known in the art and that is not indicated here for simplicity.

A selection stage 23, known as "program load" is further coupled between the voltage regulator 19 and the column selector 13 and is essentially formed by a controlled switch that connects the column selector 13 to the output of the voltage regulator 19 only during programming for biasing the addressed bit line 15 at a voltage such as to ensure that the array access device terminal (commonly the drain terminal) of the addressed memory cell 16 is supplied with a preset electrical potential, for example in a phase change memory device with MOS architecture of approximately 1 V for setting, 2 V for resetting or 0 V (or floating) if deselected, according to whether the datum that is to be programmed in the memory cell 16 addressed is "0" or "1".

During reading, instead, program load 23 disconnects the charge pump 18 and the voltage regulator 19 from the column selector 13, the latter being thus connected to the output of a read circuit 24, which, as known, carries out reading of the contents of the addressed memory cell 16 by comparing the current flowing in the addressed memory cell 16 (or a quantity correlated thereto) with the current flowing through a reference memory cell (not shown) having known contents.

For a more detailed treatment of a circuit structure of a sense amplifier, see for example European patent application 99830348.1 filed on Apr. 6, 1999 in the name of the present applicant and published as EP-A-1058270.

As described in the above patent application, the read circuit 24 comprises, among others, a biasing stage 25 having a negative feedback cascode structure for biasing the addressed bit line 15 at a voltage such as to ensure that, during reading, a preset electrical potential, typically approximately 0.4 V in a phase change memory device, will be present on the array access device terminal of the addressed memory cell 16.

In particular, the biasing stage 25 comprises an NMOS transistor 26 and a NOR logic gate 27. The NMOS transistor 26 has drain terminal connected to a sense amplifier 28 in turn connected to the supply line 17 set at the supply voltage $V_{DD}$, which is supplied from outside to the nonvolatile memory device 10, source terminal connected to the column selector 13, and gate terminal connected to the output of the NOR logic gate 27; NOR logic gate 27 has a first input connected to the source terminal of the NMOS transistor 26 and a second input receiving a logic enabling signal EN, that allows the biasing stage 25, and consequently the read circuit 24, to be turned on and off.

In FIG. 4, moreover, A designates the input node of the column selector 13, connected, during reading, to the read circuit 24 and, during programming, to the output of the voltage regulator through the program load 23, B designates the node between the first NMOS transistor 20 and the second NMOS transistor 21 of the column selector 13, C designates the node between the second NMOS transistor 21 and the third NMOS transistor 22 of the column selector 13, and D designates the array access device terminal of the addressed memory cell 16.

From an analysis of the column selection architecture shown in FIG. 4, it may be immediately understood that the voltage on the node D is equal to the voltage present on the node A minus the three voltage drops on the selection switches 20, 21 and 22 that form the column selector 13, which are in turn proportional to the series resistances RON of the transistors that form the selection switches (when on), as well as to the current flowing therein.

Consequently, the voltage on the node D is affected by imprecisions due not only to the variations in the technological process used to implement the transistors that form the selection switches 20, 21 and 22 and on the variations of the current drawn by the memory cell 16, but also, and above all, to the temperature; moreover, the higher the number of selection switches that form the column selector 13, the less precise and controllable the voltage of the node D, both during programming and reading.

Furthermore, in the column decoding architecture shown in FIG. 4, the noise present on the node A, on the node B or on the node C and mainly consisting of fluctuations of the electrical potentials of these nodes is transmitted as such to the node D, with evident disturbance on the operation that is being carried out, whether reading or programming.

The aforesaid two factors of disturbance and imprecision on the biasing voltages of the array access device terminals of the memory cells, as previously mentioned, adversely affect the precision of the levels programmed in the memory cells, the corresponding programming time and the safe detection of the cell content in read operation: in other terms they affect yield, performance and reliability of the device.

In addition, when the aim is to reduce the biasing voltage of the array access device terminal of the addressed memory cell 16, for example to bring it as low as few hundred millivolts, as required by some non volatile memory technology, this problem becomes even more accentuated and may even jeopardize the robustness, if not indeed the feasibility, of nonvolatile memory devices having the aforesaid characteristics.

BRIEF SUMMARY OF THE INVENTION

According to principals of the present invention a nonvolatile memory device is provided which can simultaneously different operations, for example reading and programming, on different groups of memory cells belonging to the same word line.

BRIEF DESCRIPTION OF THE SEVERAL VIEWS OF THE DRAWINGS

For a better understanding of the present invention, some preferred embodiments thereof are now described, purely as non-limiting examples, with reference to the attached drawings, wherein.

DETAILED DESCRIPTION OF THE INVENTION

Figure 1:
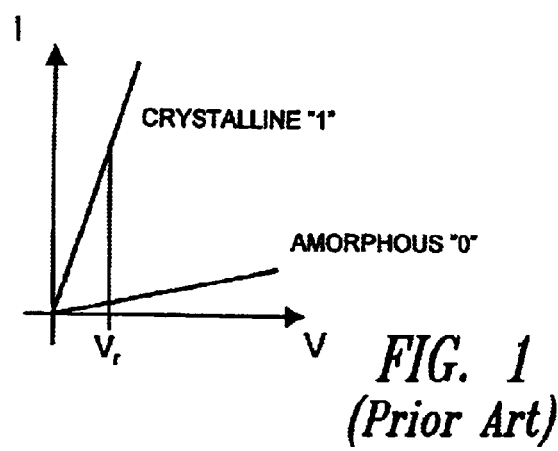
FIG. 1 shows the current-versus-voltage characteristic of a phase change material.
Figure 2:
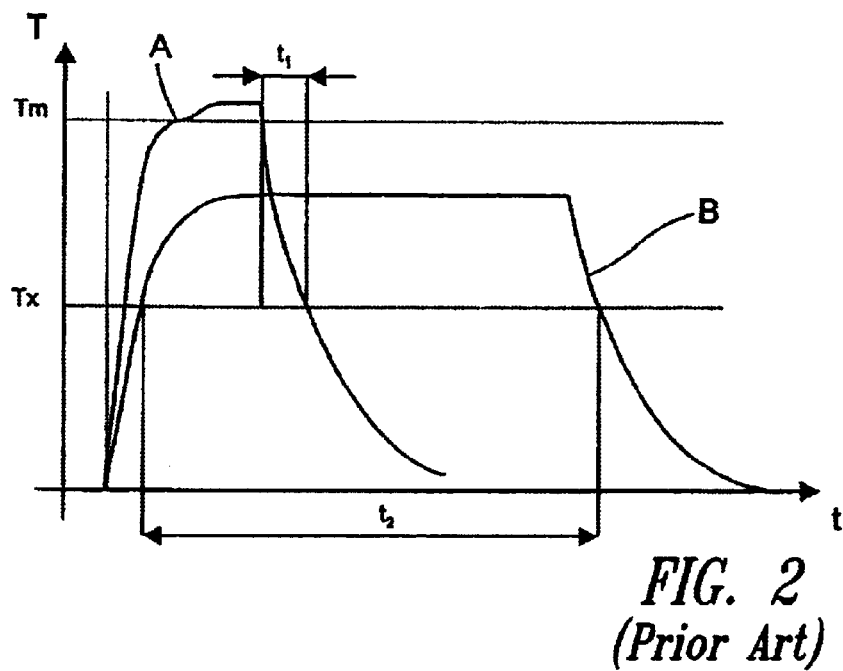
FIG. 2 shows the temperature-versus-current plot of a phase-change material.
Figure 3:
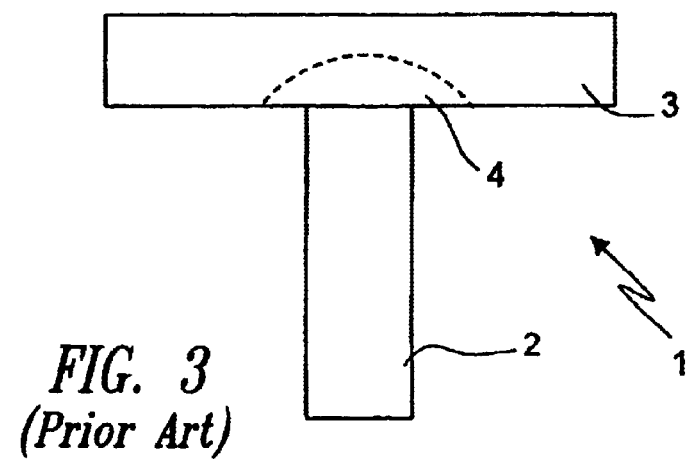
FIG. 3 shows the basic structure of a PCM storage element.
Figure 4:
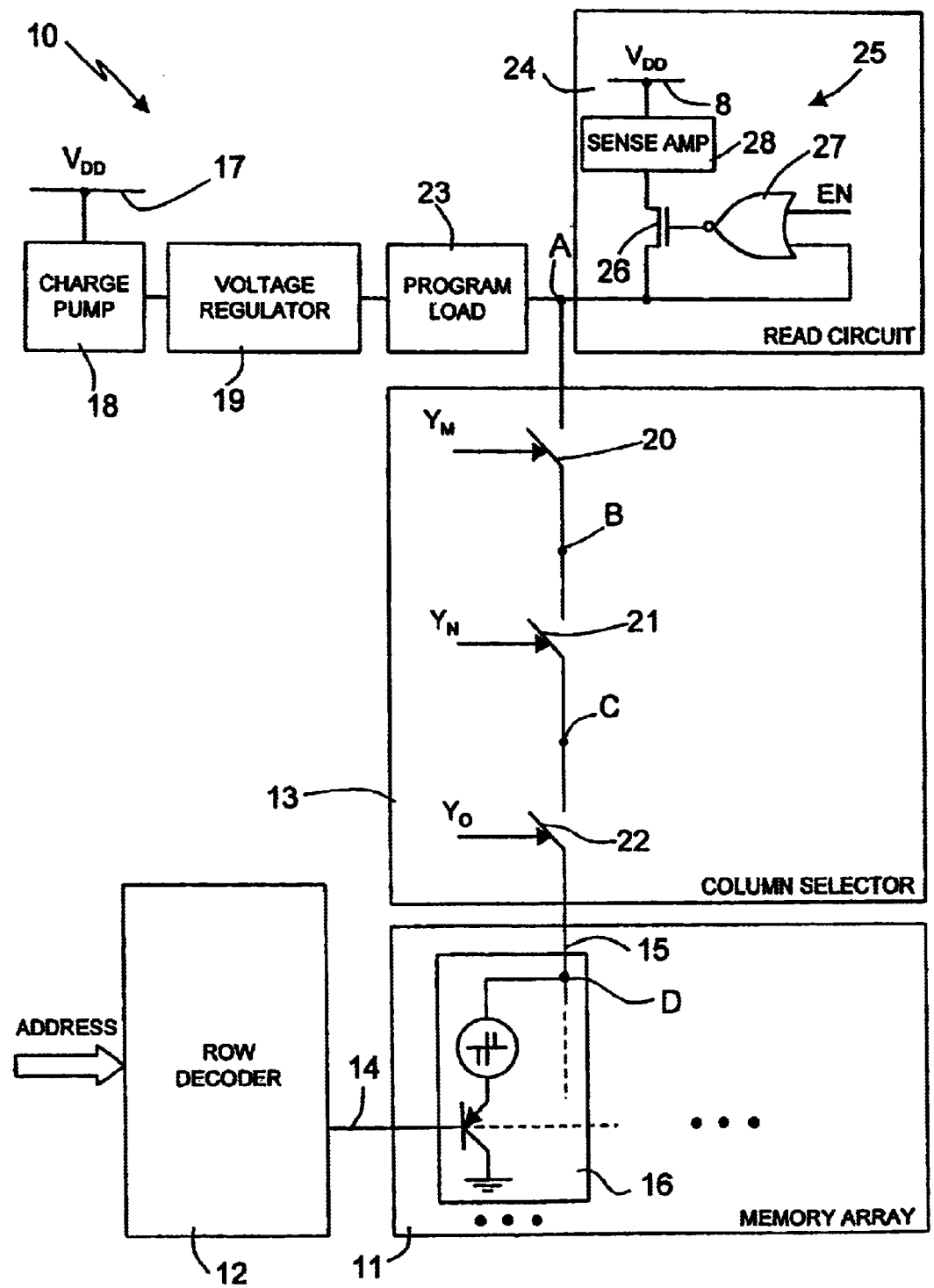
FIG. 4 shows a circuit diagram of part of a known nonvolatile memory device.
Figure 5:
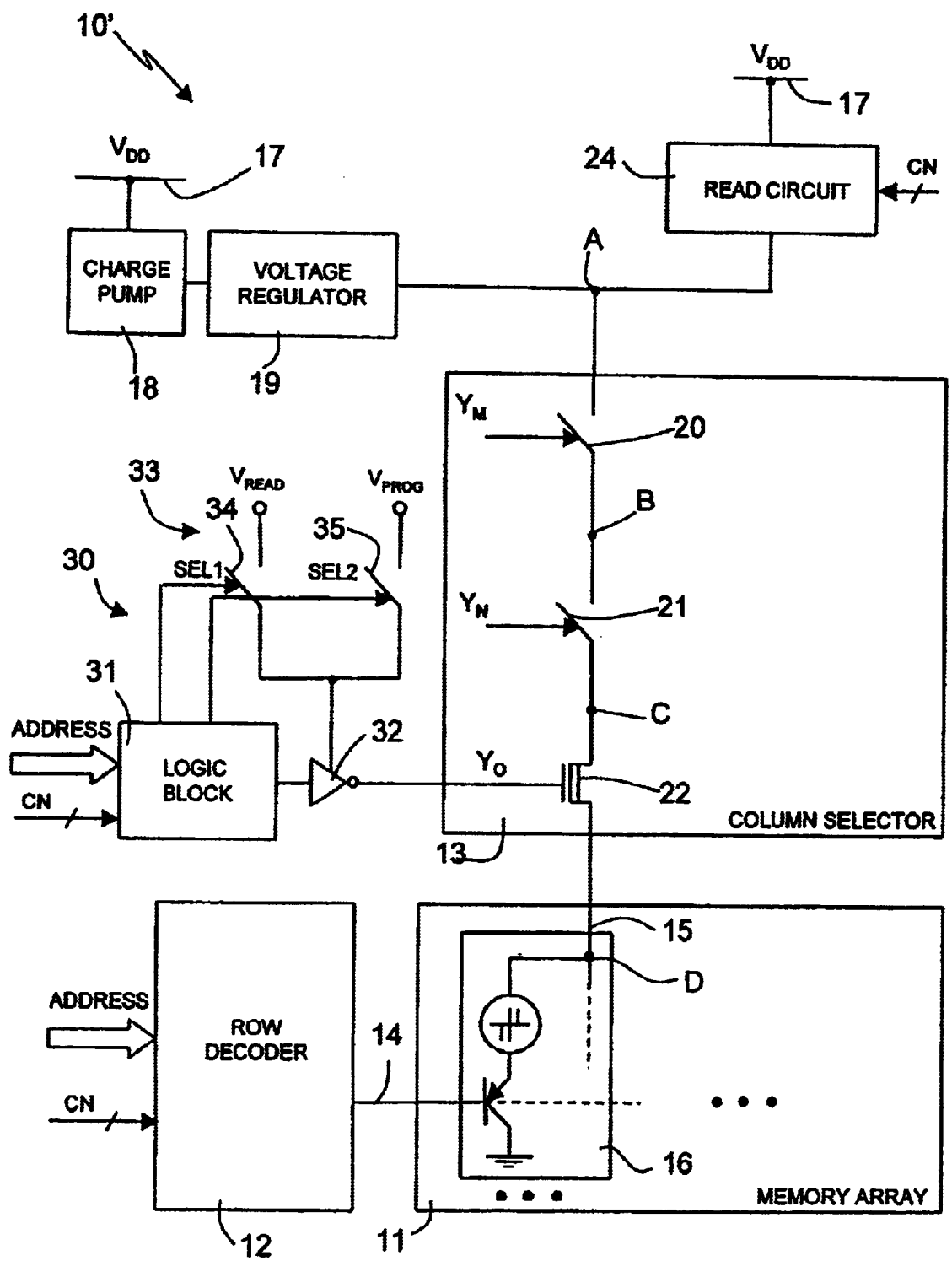
FIG. 5 shows a circuit diagram of part of a nonvolatile memory device according to a first embodiment of the present invention.

FIG. 5 is a schematic representation of a nonvolatile memory device according to a first embodiment of the present invention and limitedly to the parts that are necessary for understanding the present invention. In FIG. 5, the parts similar to those of FIG. 4 are designated by the same reference numbers.

As shown in FIG. 5, the nonvolatile memory device, designated as a whole by 10', differs from the nonvolatile memory device 10 of FIG. 4 in that the array access device terminal of the addressed memory cell 16 is biased by exploiting, as described in detail hereinafter, the selection switch of the column selector 13 which is physically closest to the addressed memory cell 16, namely the selection switch that has its source terminal connected to the array access device terminal of the memory cell 16, i.e., in the example illustrated the selection switch 22.

In particular, in order to obtain this, the selection switch 22 is formed by an NMOS transistor driven by a driving circuit 30 including a logic block 31 and an output buffer 32, which are cascaded together. The output buffer 32 is supplied by one of two or more regulated voltages $V_{READ}$, $V_{PROG}$ according to the operation that the memory cell needs to perform through the activation of one of the two or more selection signals SEL1, SEL2.

In detail, the logic block 31 generates a logic signal which is inputted to the output buffer 32 and which is the result of some control signals CN reflecting the operation to be performed on the memory cell 16 and of the decoding of some of the column addresses supplied to the memory device 10', control signal CN which are also supplied to the row decoder 12 and to the read circuit 24.

The logic block 31 also generates the selection signals SEL1, SEL2 that are inputted to selection inputs of a multiplexer 33 that enables to supply the output buffer 32 with one of two or more regulated voltages $V_{READ}$, $V_{PROG}$ in such a way that the gate of the NMOS 22 is not only activated according to the proper address, but also the gate voltage of NMOS 22 is driven to one of two or more different analog voltages $V_{READ}$, $V_{PROG}$ that is required for the operation of the memory cell 16. For example the gate of NMOS 22 can be driven to a read voltage $V_{READ}$ to read memory cell 16, and to a different program voltage $V_{PROG}$ to write memory cell 16. More in general, more than two regulated voltages can be used, for example in order to obtain read with margin or if more than one voltages are necessary for write operations with different contents or for other purposes (i.e., topological compensation).

In particular, multiplexer 33 has first and second voltage inputs receiving the read voltage $V_{READ}$ and the program voltage $V_{PROG}$, respectively, first and second selection inputs receiving the selection signals SEL1, SEL2, respectively, and an output connected to a supply input of the output buffer 32 and selectively connectable to the first or to the second input of the multiplexer 33 according to which of the selection signals SEL1, SEL2 is activated.

Multiplexer 33 may be schematically represented as shown in FIG. 5, i.e., by two switches 34, 35 which are controlled in phase opposition by the selection signals SEL1 and SEL2, and each of which is connected between a respective input and the output of the multiplexer 33.

The selection switch 22 is formed by an NMOS transistor having a drain terminal connected to the selection switch 21, a source terminal connected to the array access device terminal of the addressed memory cell 16, and a gate terminal connected to the output of the output buffer 32.

The selection transistor 22 may be either of traditional type or of a natural type, i.e., having a zero threshold voltage, or else may be a transistor with a controlled threshold voltage lower than a traditional NMOS transistor.

The selection transistor 22 driven by the driving circuit 30 of the type described above defines a cascoded structure which causes the voltage of the node D to be:

$$V_D = V_G - V_{GS} = V_G - (V_{TH} + V_{OV})$$

where $V_G$ is the biasing voltage of the gate terminal of the selection transistor 22, $V_{GS}$ is the voltage between the gate and the source terminal of the selection transistor 22, $V_{TH}$ is the threshold voltage of the selection transistor 22, including the body-bias impact, and $V_{OV}$ is the overdrive voltage of the selection transistor 22, which depends upon the current absorbed by the memory cell 16 addressed, as well as upon the size of the selection transistor 22.

It is possible to design the size and the biasing of the transistors 20, 21 so that the voltage of the node D depends almost exclusively on the voltage supplied to the gate terminal of the selection transistor 22, and not on the voltage of the node A or of any node intermediate to the column selector 13.

By then appropriately biasing the gate terminal of the selection transistor 22 it is possible to bias, both during reading and writing, the array access device terminal of the addressed memory cell 16 at the desired voltage, which is independent both of the voltage drops on the selection switches 20 and 21 of the column selector 13 and of any ripples or fluctuations possibly present on all these nodes.

Consequently, the constraints on the stability and precision of the voltage of the node A are less stringent as compared to those of prior art nonvolatile memory devices, so that downstream from the charge pump 18 a voltage regulator 19 could be used having less marked characteristics of precision or regulation, or alternatively the voltage regulator could be omitted altogether, with the evident benefits that derive therefrom.

In addition, the precision and stability of the voltage of the node D depend almost exclusively upon the precision and stability of the voltage supplied to the gate terminal of the selection transistor 22 which in turn depends on the voltages $V_{READ}$, $V_{PROG}$. It must be noted that nodes $V_{READ}$, $V_{PROG}$ are not required to supply DC currents and thus can be designed in such a way as to ensure the required precision and stability. The dependence of the voltage of the node D upon the variations with temperature in the characteristics of the selection switches of the column selector 13 is thus eliminated.

Furthermore, the presence of the cascoded structure according to the present invention renders practically superfluous the biasing stage 25 required in FIG. 4 as part of the prior art read circuit 24. In the case of present invention, the read circuit 24 (FIG. 5) can be reduced to only the sense amplifier, with evident benefits in terms of reduction of area occupied on the silicon.

In addition it is possible to track the variations in the characteristics of the selection transistor 22 as the temperature varies, by suitably acting on the voltages $V_{READ}$ and $V_{PROG}$.

It should moreover be emphasized that in the first embodiment of the invention the selection transistor 22 performs a dual function: its traditional function of selecting the addressed column of the memory array 11, together with the selection switches 20 and 21, in so far as the driving signal supplied by the logic block 31 is generated according to the addresses supplied to the nonvolatile memory device 10□, and a function of biasing the array access device terminal of the addressed memory cell 16 at a precise and stable voltage which is independent of the voltage supplied by the voltage regulator 19.

Figure 6:
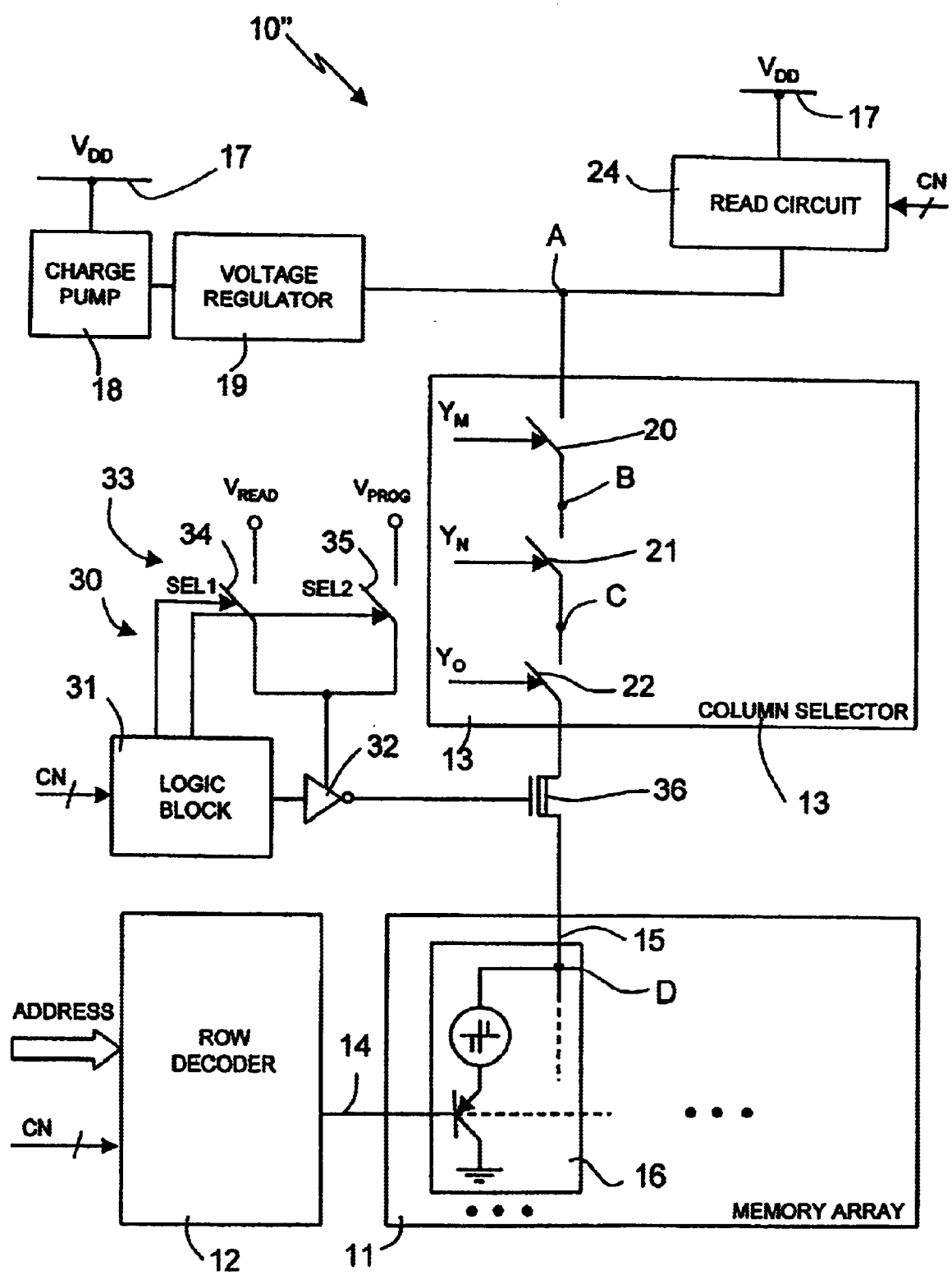
FIG. 6 shows a circuit diagram of part of a nonvolatile memory device according to a second embodiment of the present invention.

FIG. 6 shows a different embodiment of the present invention, in which parts similar to those of FIG. 5 are designated by the same reference numbers.

In particular, the nonvolatile memory device illustrated in FIG. 6, designated by 10□□, differs from the nonvolatile memory device 10' in that cascading of the node D is not obtained by exploiting the selection switch 22 of the column selector 13 that is physically closest to the memory cell 16 addressed, but rather through a further cascoding transistor, designated by 36, which is distinct from the transistors forming the selection switches 20, 21 and 22 and is arranged between the column decoder 13 and the addressed memory cell 16. In such a way, the column selection function is fully performed by the transistors 20, 21 and 22 of the column selector 13, while the cascading transistor 36 has only the function of regulating the voltage on the node D according to the operation to be performed by the memory cell 16.

Consequently, in the second embodiment, the logic block 31 no longer receives some of the addresses supplied to the nonvolatile memory device 10□□, but simply some control signals CN that indicate the operation, for example reading or programming, that is to be carried out on the addressed memory cell 16.

It is pointed out that in both of the embodiments of the present invention described above, in order to regulate the voltage on the array access device terminals of the memory cells 16 it is necessary to provide a cascoding transistor for each bit line 15 of the memory array 11, whether the cascoding transistor is made by exploiting the selection transistor of the column selector that is physically closest to the memory cell addressed or by using an additional transistor.

Figure 7:
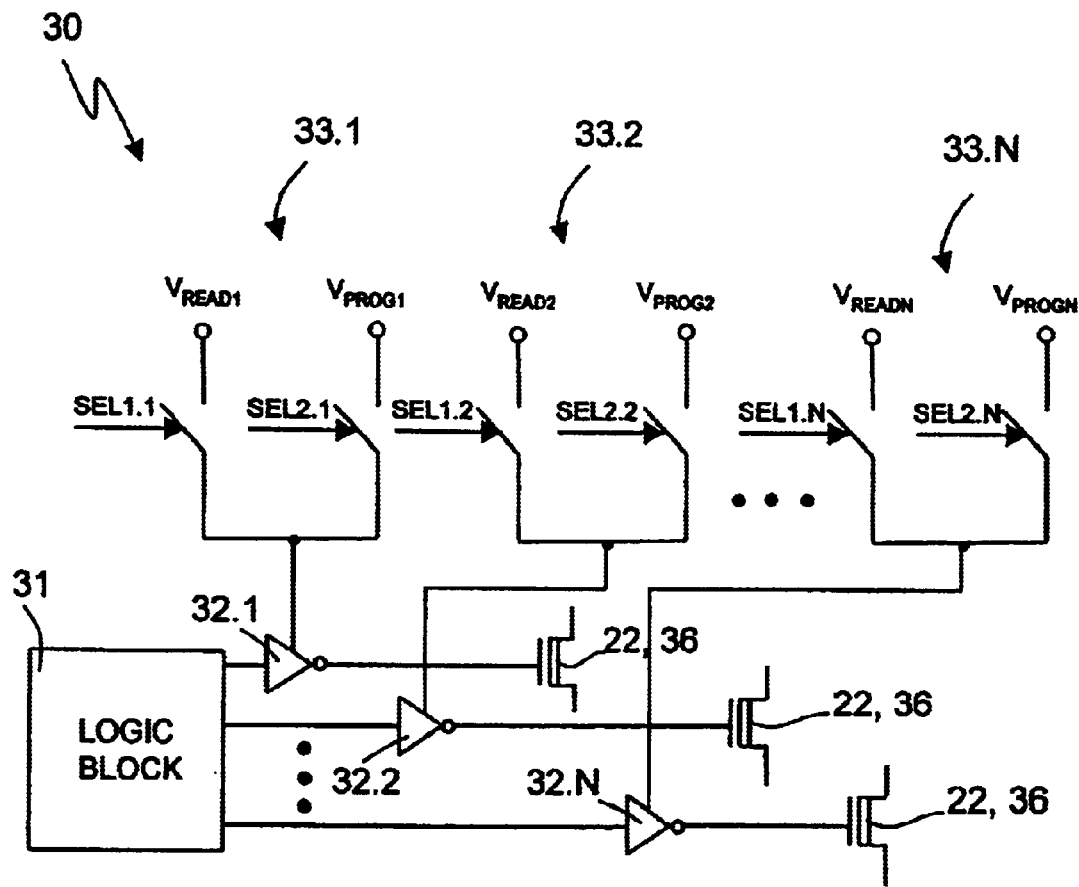
FIG. 7 shows an architecture which makes it possible to perform simultaneously different operations on different groups of memory cells belonging to the same word line.

According to another aspect of the present invention, the driving circuit 30 may be designed to drive a single cascoding transistor, as shown in FIGS. 5 and 6, or to drive simultaneously a number of cascoding transistors according to the degree of parallelism adopted during reading or writing, defined as the number of memory cells 16 on which a same operation (reading or writing) is performed simultaneously, as shown in FIG. 7.

In particular, as will be clarified hereinafter, this type of architecture makes it possible also to perform simultaneously different operations, for example reading and programming, on different groups of memory cells belonging to the same word line, and this bestows on the nonvolatile memory device according to the invention a degree of flexibility of use which cannot be achieved by the nonvolatile memory devices according to the prior art. This last further degree of flexibility can be exploited provided that the cell technology requires the same word line voltages (selected and unselected) to be applied to the cells both in reading and in programming and the differentiation between the different operations is only obtained by differentiating the bit line biasing. An example of such a technology is just the Phase Change technology, based on the electrical switching of a portion of a Chalcogenide material from amorphous to crystalline, as described in U.S. Pat. No. 5,296,716.

In order to understand fully the above, consider the following example: assume that a degree of parallelism of 2 bytes (16 bits) is adopted, i.e., that the column selection architecture allows simultaneous addressing of sixteen bit lines at a time, that the cascoding transistors associated to eight of the sixteen bit lines that can be addressed simultaneously are connected to a first set of driving circuits 30, that the cascoding transistors associated to the remaining eight bit lines that can be addressed simultaneously are connected to a second set of driving circuits 30, that the multiplexers 33 of the first set of driving circuits 30 are controlled so as to supply the corresponding set of output buffers 32 with the read voltage $V_{READ}$, and that the multiplexers 33 of the second set of driving circuits 30 are controlled so as to supply the corresponding set of output buffers 32 with one or more programming voltages $V_{PROG}$.

If one word line 14 of the memory array 11 and sixteen bit lines 15 are now addressed, with the architecture illustrated above it is possible to simultaneous read the eight addressed memory cells 16 that are cascoded through the first set of biasing circuits 30, and programming the addressed eight memory cells 16 that are cascoded through the second set of biasing circuits 30.

In fact, the gate terminals of the cascading transistors 22 connected to the first set of biasing circuits 30, and thus the array access device terminals of the memory cells 16 connected thereto, are biased at the read voltage $V_{READ}$, thus enabling reading of these memory cells 16 (reading of a first one of the two bytes), while the gate terminals of the cascading transistors 22 connected to the second set of biasing circuits 30, and thus the array access device terminals of the memory cells 16 connected thereto, are biased at one or more programming voltage $V_{PRO}$, thus enabling programming of these memory cells 16 (programming of the second one of the two bytes).

The architecture described above can obviously be extended to any degree of parallelism that it is desired to adopt, even to a degree of parallelism at the level of the individual bit.

An example of an architecture which makes it possible to perform simultaneously different operations on N different memory cells 16 is schematically shown in FIG. 7. In particular, the N cascoding transistors (whether they are made by exploiting the selection transistors of the column selector that are physically closest to the memory cells addressed or by using additional transistors) which are arranged on the N bit lines 15 to which the N different memory cells 16 are connected, are driven by respective output buffers, designated by 32.1, 32.2., . . . , 32.N, which are in turn connected to one and the same logic block 31 and are supplied by respective multiplexers, designated by 33.1, 33.2., . . . , 33.N. In detail, the logic block 31 generates N logic signals which are the result of the control signals CN reflecting the operation to be performed on the memory cells 16 and of the decoding of some of the column addresses supplied to the memory device, and which are inputted to the output buffer 32, and N pairs of selection signals, designated by SEL1.1, SEL2.1, SEL1.2, SEL2.2, . . . , SEL1.N, SEL2.N, which are inputted to the selection inputs of the multiplexers 33.1, 33.2., . . . , 33.N. The voltage inputs of the multiplexers 33.1, 33.2., . . . , 33.N receive a read voltage and a program voltage, designated as $V_{READ1}$, $V_{PROG1}$, $V_{READ2}$, $V_{PROG2}$, . . . , $V_{READN}$, $V_{PROGN}$, and the outputs of multiplexers 33.1, 33.2., . . . , 33.N are connected to the supply inputs of the respective output buffers 32.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous modifications and variations may be made to the memory device described and illustrated herein, without thereby departing from the scope of the present invention, as defined in the attached claims.

What is claimed is:

1. A nonvolatile memory device comprising:

a memory array including a number of memory cells;

row decoding means;

column selection means connected to said memory array for addressing said memory cells;

biasing means arranged between said column selection means and said memory array for biasing a current conduction terminal of an addressed memory cell, said biasing means having a cascode structure and including a biasing transistor means having a first current conduction terminal connected to said column selection means, a second current conduction terminal connected to said current conduction terminal of said addressed memory cell, and a control terminal receiving a driving signal, said biasing means further including driving means receiving at least one control signal indicating the operation to be performed on said addressed memory cell, a first reference voltage and at least a second reference voltage, and generating said driving signal for said biasing transistor means, said driving signal assuming levels which are defined by said first or by said second reference voltage according to said control signal.

2. The nonvolatile memory device according to claim 1 wherein said driving means comprise a logic block and an output buffer cascade-connected, and a multiplexer for supplying said output buffer, said logic block receiving said control signal and generating at least one selection signal, and said multiplexer having a first voltage input biased at said first reference voltage and at least a second voltage input biased at said second reference voltage, a selection input receiving said selection signal, and an output connected to a supply input of said output buffer and selectively connectable to the first voltage input or to the second voltage input of the multiplexer according to said selection signal.

3. The nonvolatile memory device according to claim 2 wherein said biasing means include a group of said biasing transistor means, that has control terminals connected to one and the same logic block via respective output buffers, said output buffers being supplied by respective multiplexers each supplied with respective first and second reference voltages.

4. The nonvolatile memory device according to claim 1 wherein said memory cells are phase change memory cells.

5. The nonvolatile memory device according to claim 1 wherein said memory array comprises a number of bit lines, and in that said biasing means comprise a number of biasing transistor means, one for each bit line.

6. The nonvolatile memory device according to claim 1 wherein said biasing transistors means (22; 36) are included as part of said column selection means (13).

7. The nonvolatile memory device according to claim 6 wherein said column selection means comprise a number of selection transistor means connected in series, and in that said biasing transistor means are formed by the selection transistor means that are closest to said addressed memory cell.

8. The nonvolatile memory device according to claim 1 wherein said biasing transistor means are distinct from said column selection means.

9. A nonvolatile memory device comprising:

a memory array including a plurality of memory cells;

a row decoder connected to said memory array;

a column selector connected to said memory array;

a biasing transistor arranged between said column selector and said memory array for biasing a current conduction terminal of an addressed memory cell, said biasing transistor having a cascode structure and having a first current conduction terminal connected to said column selector, a second current conduction terminal connected to said current conduction terminal of said addressed memory cell, and a control terminal; and a driving circuit coupled to the control terminal of the biasing transistor.

10. The device according to claim 9 wherein the column selector includes a plurality of column selection lines and a biasing transistor is coupled to each column selection line.

11. The device according to claim 10 wherein the driving circuit includes a multiplexer for selectively coupling the biasing transistor to a first voltage or a second voltage, higher than the first voltage.

12. The device according to claim 11 wherein the first voltage is at a read voltage level and the second voltage is at a program voltage level with respect to the memory cells in the memory array.

* * * * *